United States Patent [19]
Ueki

[11] Patent Number: 5,288,663
[45] Date of Patent: Feb. 22, 1994

[54] METHOD FOR EXTENDING WAFER-SUPPORTING SHEET

[75] Inventor: Tetsuro Ueki, Hachioji, Japan

[73] Assignee: Casio Computer Co., Ltd., Tokyo, Japan

[21] Appl. No.: 53,878

[22] Filed: Apr. 27, 1993

[30] Foreign Application Priority Data

Apr. 28, 1992 [JP] Japan .................. 4-134331

[51] Int. Cl.⁵ .............................. H01L 21/00
[52] U.S. Cl. .................... 437/250; 437/226; 148/DIG. 28
[58] Field of Search ............ 437/250, 226, 227, 8, 437/209; 269/21; 148/DIG. 28; 209/573

[56] References Cited

U.S. PATENT DOCUMENTS

| | | | |
|---|---|---|---|
| 3,887,996 | 6/1975 | Hartleroad et al. | 437/209 |
| 4,285,433 | 8/1981 | Garrett, Sr. et al. | 209/573 |
| 4,543,464 | 9/1985 | Takeuchi | 219/121.68 |
| 4,590,667 | 5/1986 | Simon | 148/DIG. 28 |
| 4,688,540 | 8/1987 | Ono | 125/13.01 |
| 4,851,371 | 7/1989 | Fisher et al. | 437/226 |
| 5,128,282 | 7/1992 | Ormond et al. | 437/227 |

Primary Examiner—Brian E. Hearn
Assistant Examiner—Kevin M. Picardat
Attorney, Agent, or Firm—Frishauf, Holtz, Goodman & Woodward

[57] ABSTRACT

In a method for extending a wafer-supporting sheet of a wafer-supporting table for dicing, the wafer-supporting sheet can be extended by using a single tool, and a total height of a wafer-supporting device can be reduced while the sheet is extended. In this wafer-supporting sheet extending method, a substantially C-shaped extension spring is arranged on a lower surface of the wafer-supporting sheet, on which a wafer divided into chips is placed, so that the sheet is extended. Thus, since the wafer-supporting sheet can be extended by a single tool (the C-shaped extension spring) and the extension spring can be made thin, the total height of the wafer-supporting device can be reduced while the sheet is extended.

19 Claims, 6 Drawing Sheets

METHOD FOR EXTENDING WAFER-SUPPORTING SHEET

BACKGROUND OF THE INVENTION

1. Field of the Invention

This invention relates to a method for extending a wafer-supporting sheet of a wafer-supporting table for dicing.

2. Description of the Related Art

Mounting of a semiconductor chip starts with dividing a wafer, which has been determined as being a defect-free product by test, into chips. This dividing process is known as "dicing". FIGS. 8 and 9(A) show a conventional dicing method in which a wafer-supporting table 3 for dicing has a ring shaped frame 1 made of metal such as stainless and having a circular opening portion 1a, and a wafer-supporting sheet 2 attached to a lower surface of the frame 1 by an adhesive (not shown). The supporting sheet 2 has a circular shape and is made of such as vinyl chloride. A wafer 4 is supported (adhered) via an adhesive (not shown) on a central portion of an upper surface of the sheet 2, and is cut into chips by means of a dicing blade (not shown). Then, defect-free chips are picked up by a vacuum head (not shown), and are moved to a next step (for example, a loading step in which the chips are loaded on a circuit board). In this case, a gap between the neighboring chips is small just after the wafer 4 have been dicied into the chips. Therefore, when a chip is picked up by a vacuum head, the chip may contact a neighboring chip, and hence the neighboring chip may be displaced from its original position. As a result, the neighboring chip may fail to be picked up.

To avoid such a problem, a pair of extension rings 5 and 6 are used to widen the gap between neighboring chips, as is shown in FIGS. 8 and 9(A). Specifically, there are provided a first extension ring 5, which is slightly smaller than the frame 1 of the wafer-supporting table 3, and a second extension ring 6, which is slightly smaller than the first extension ring 5. As is shown in FIG. 9(A), the first and second extension rings 5 and 6 are arranged above and under the wafer-supporting sheet 2, respectively. Then, as is shown in FIG. 9(B), the second extension ring 6 is inserted into the opening portion 1a of the frame 1 from the under side thereof, and is pushed up with making an upper surface of the second expansion ring 6 extend the wafer-supporting sheet 2. Finally, as is shown in FIG. 9(C), the first extension ring 5 is fitted onto the second extension ring 6 from above the frame 1 with the wafer-supporting sheet 2 being interposed therebetween. In this state, the sheet 2 is extended by two times a total of the widths of the extension rings 5 and 6, and the gap between the neighboring chips is increased in accordance with the amount of extension.

However, since the conventional wafer-supporting-sheet extending method uses two tools (=the extension rings 5 and 6) to extend the wafer-supporting sheet 2, manufacturing cost is greater than in a case where only a single tool is used. Further, since the sheet 2 is extended in a direction perpendicular to its supporting surface, the widths of the rings 5 and 6 must be increased in order to increase the amount of extension of the sheet 2 so that a total height of the wafer-supporting table 3 in a state as shown in FIG. 9(C) (i.e., the width of each of the rings 5 and 6, two times the thickness of the sheet 2, and the thickness of the wafer 4) becomes large. As a result, a large space is necessary to storage a plurality of wafer-supporting tables 3 (each of which is in the state shown in FIG. 9(C) while they are arranged in a vertical direction with they being held in a horizontal posture.

SUMMARY OF THE INVENTION

The present invention has been derived from the above circumstances, and its object is to provide a method for extending a wafer-supporting sheet, in which the wafer-supporting sheet can be extended by using a single tool, and a total height of a wafer-supporting device can be reduced while the sheet is extended.

To achieve the object, the method of the invention comprising: a step for preparing a wafer-supporting table which is constructed by attaching a circular wafer-supporting sheet to a lower surface of a ring-shaped frame, a wafer placed on an upper surface of the wafer-supporting sheet and divided into chips, and a C-shaped extension spring having an outer diameter larger than an inner diameter of the ring-shaped frame when the spring is unloaded; a step for contracting the extension spring by applying an external force so that the outer diameter of the spring becomes smaller than the inner diameter of the ring-shaped frame; a step for extending the wafer-supporting sheet by positioning a portion of the sheet, which is located inside of an inner periphery of the frame, above the frame with an external force applying to the portion of the sheet; a step for positioning the extension spring above the frame by inserting the extension spring from under the wafer-supporting table into an inner space surrounded by the inner periphery of the frame; a step for releasing the external force applied to the extension spring; and a step for releasing the external force applied to the portion of the sheet which is located inside of the inner periphery of the frame.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 5(A)-5(D) show steps for extending the wafer-supporting sheet by the wafer-supporting sheet extending apparatus, in which FIG. 5(A) shows a state that a wafer-supporting sheet supporting a diced wafer and being attached to a ring shaped frame is located above an extension spring-placing unit, FIG. 5(B) shows a state that the extension spring-placing unit is moved upward to extend the wafer-supporting sheet by its projecting portion, FIG. 5(C) shows a state that the extension spring-placing unit is moved downward to leave an extension spring extending the wafer supporting sheet, and FIG. 5(D) shows a state that the extension spring-placing unit is returned to its original lowered position and the extension of the wafer-supporting sheet is kept by the left extension spring;

FIGS. 9(A)–9(C) show steps for extending a wafer-supporting sheet in the conventional method, in which FIG. 9(A) shows a state that first and second extension rings having different diameters each other are coaxially located above and below a wafer-supporting sheet supporting a diced wafer and being attached to a ring shaped frame, FIG. 9(B) shows a state that the wafer-supporting sheet is extended by the upwardly moved second extension ring, and FIG. 9(C) shows a state that the first extension ring is moved downward to be fitted over the second extension ring so that the extended supporting sheet is sandwiched by the first and second extension rings fitted each other.

DETAILED DESCRIPTION OF THE PREFERRED EMBODIMENT

Figure 1:
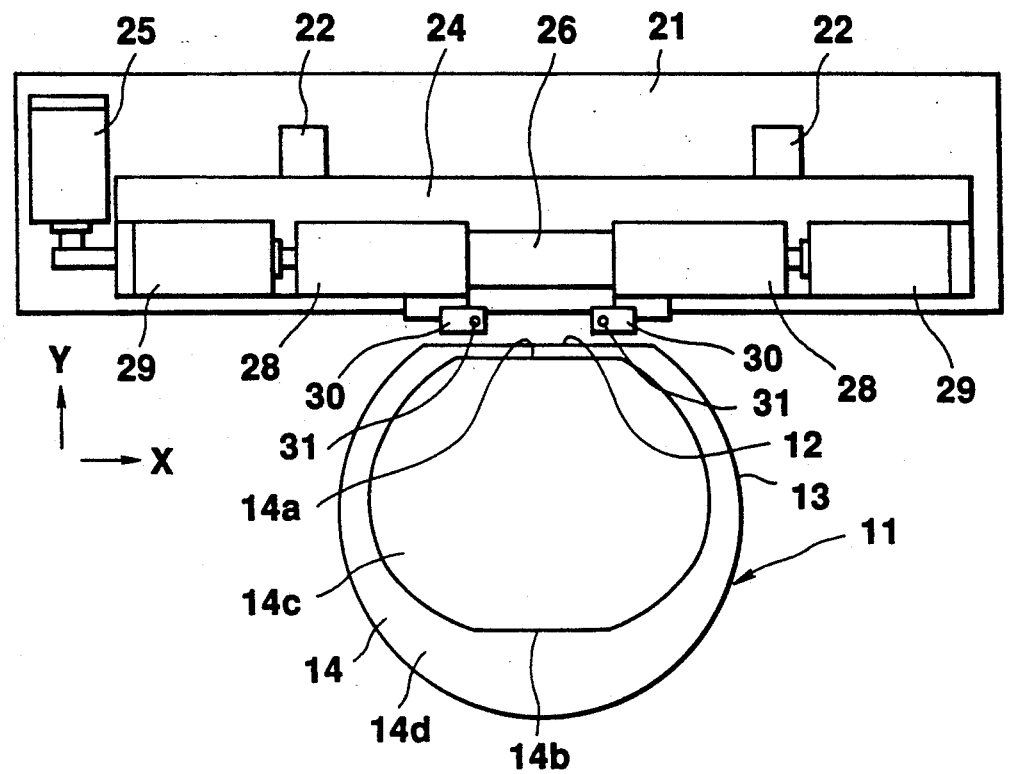
FIG. 1 is a plan view showing a main part of a wafer-supporting sheet extending apparatus employed in an embodiment of the invention.
Figure 2:
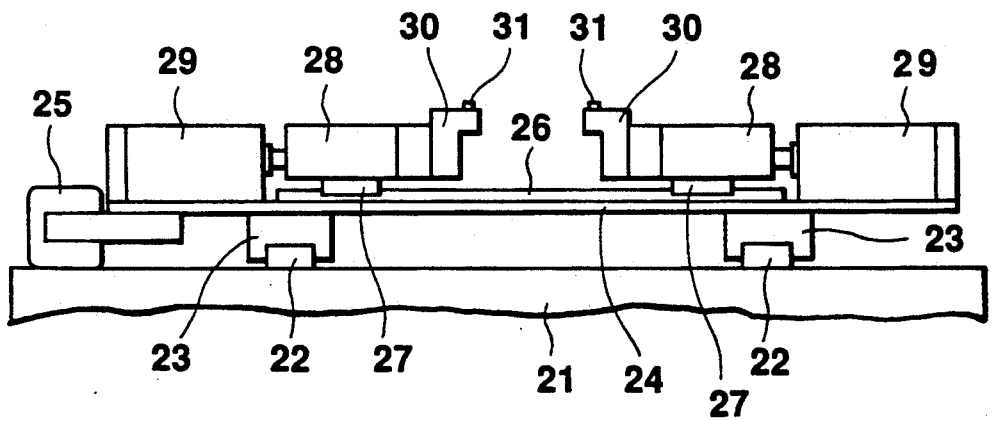
FIG. 2 is a plan view showing a part of the apparatus in FIG. 1.

FIGS. 1 and 2 show a main part of a wafer-supporting sheet extending apparatus used in an embodiment of the invention. The wafer-supporting sheet extending apparatus has a vertically movable base 11, a vertically movable table 21, and fixing means (not shown) for fixing a wafer-supporting table for dicing. The fixing means has a ring-shaped fixing base provided around the vertically movable base 11, and a ring-shaped pressing base mounted on the fixing base to be movable in a vertical direction. The vertically movable base 11 has a construction that an extension spring-placing unit 14 is provided on an upper portion of a cylindrical column 13. One portion in a peripheral surface of the cylindrical column 13 is formed as a flat surface 12. The unit 14 consists of a generally circular projecting portion 14c (see FIG. 5(A)) both side surfaces of which being in parallel with the flat surface 12 of the cylindrical column 13 are formed as flat surfaces 14a and 14b, and an extension spring-placing surface 14d provided around the projecting portion 14c.

A pair of rails 22 are mounted in predetermined two positions on an upper surface of the vertically movable table 21 to be extended in a direction indicated by an arrow Y. A movable table 24 is attached to the rails 22 via rail catches 23 to be freely reciprocated. The movable table 24 is reciprocated by a first cylinder 25 provided in a predetermined position on an upper surface of the vertically movable table 21. A rail 26 is mounted in a predetermined position on the upper surface of the movable table 24 to be extended in a direction indicated by an arrow X. A pair of movable blocks 28 are attached on the rail 26 via rail catches 27 to be arranged symmetrically with each other and to be freely reciprocated. The paired movable blocks 28 are reciprocated by second cylinders 29 provided in predetermined two positions on an upper surface of the movable table 24. A projecting portion 30 is provided on that side of a tip end portion of each movable block 28 which projects in a direction opposing to the Y direction. An extension spring-contracting pin 31 is mounted on an upper surface of a projecting end of each projecting portion 30. The paired extension spring-contracting pins 31 are arranged in positions which oppose to the one flat surface 14a of the extension spring-placing unit 14 of the vertically movable base 11.

Figure 3:
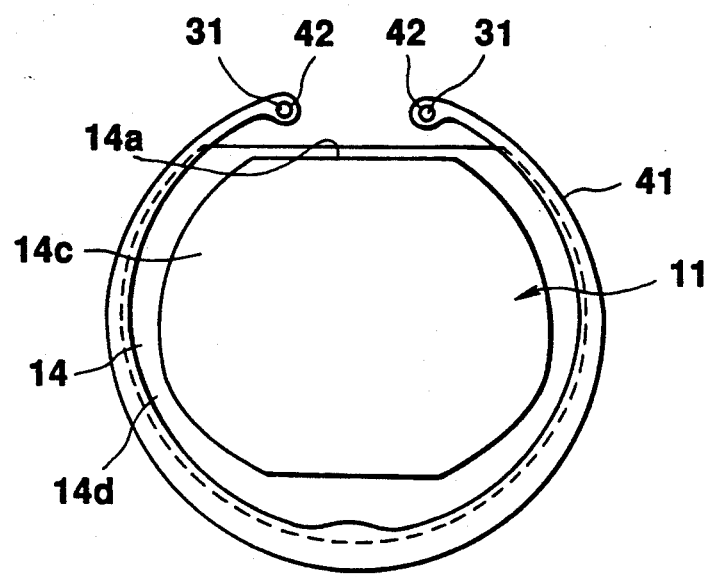
FIG. 3 is a plan view showing a state in which an extension spring in an unloaded condition is placed on an extension spring-placing portion of the wafer-supporting sheet extending apparatus.
Figure 5A:
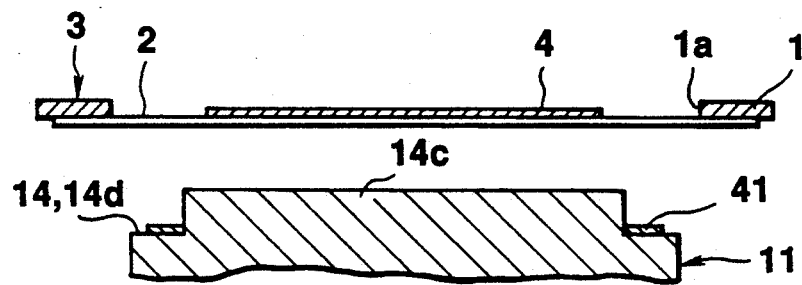
Figure 7:
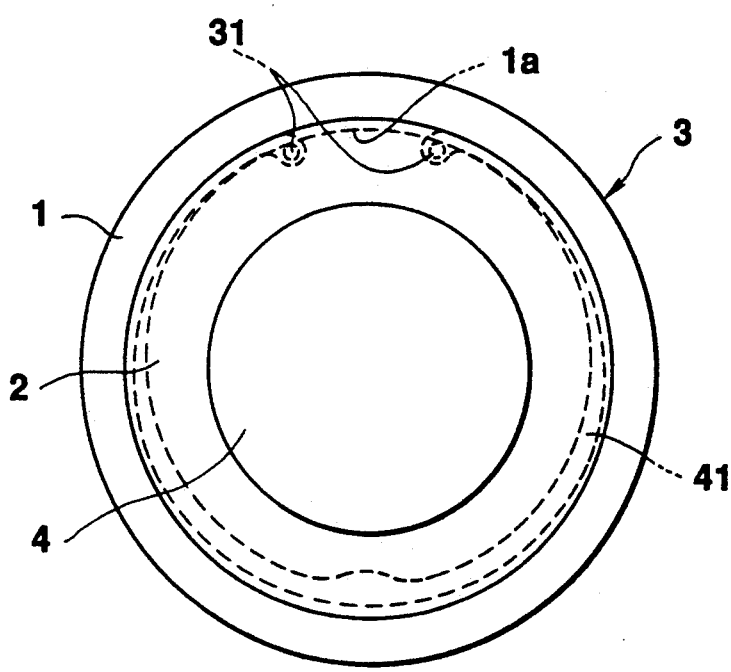
FIG. 7 is a plan view of FIG. 5(D)
Figure 8:
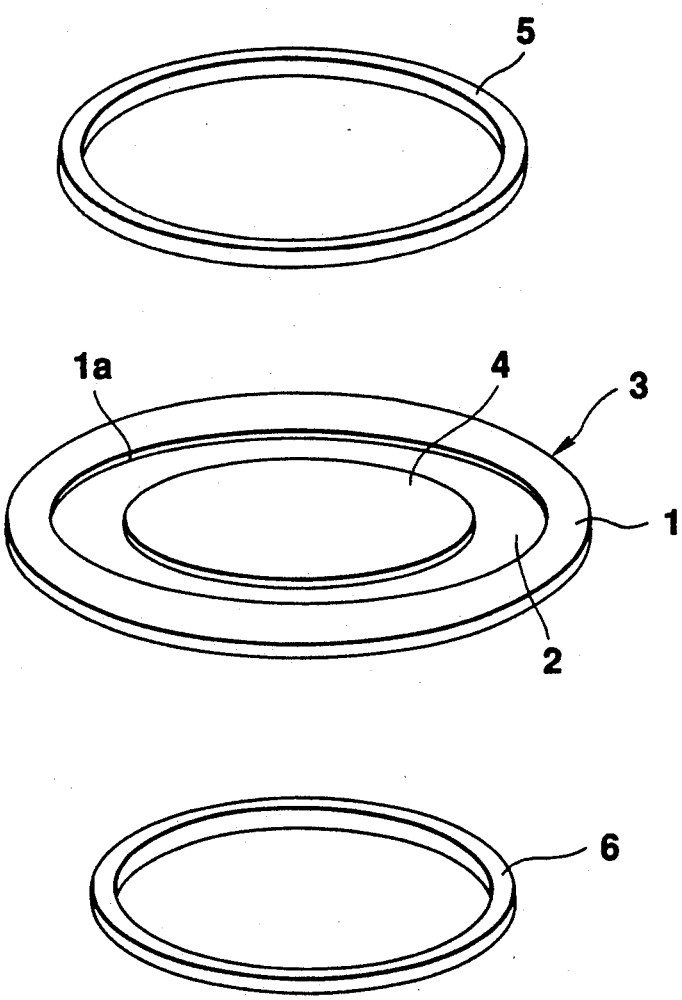
FIG. 8 is a perspective view for explaining a conventional wafer-supporting-sheet extending method.
Figure 9A:
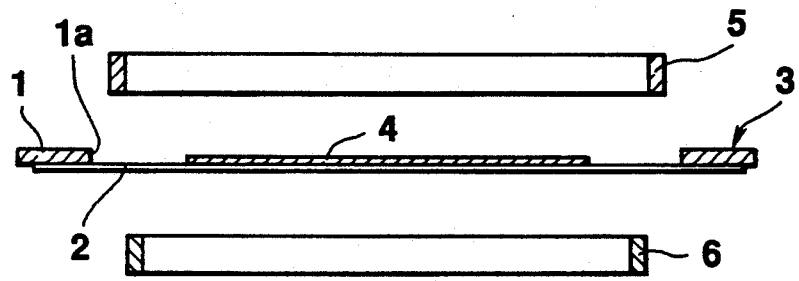
Figure 9B:
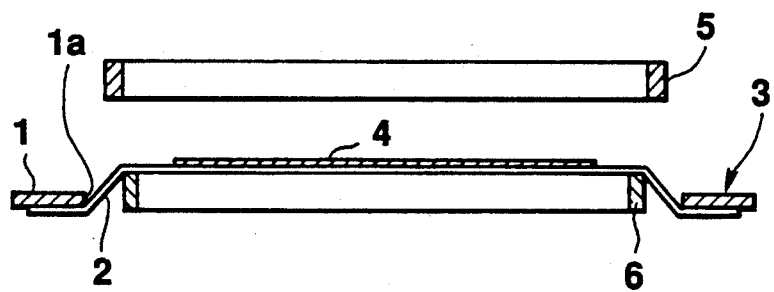
Figure 9C:
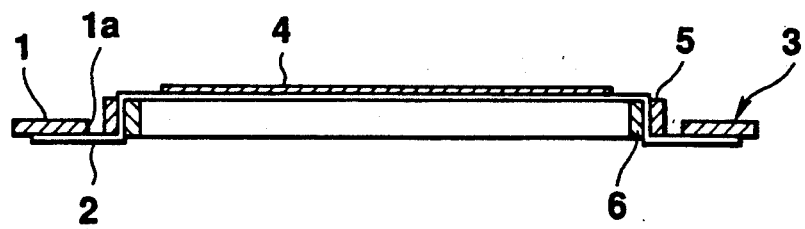

An extension spring used in the wafer-supporting-sheet extending method performed by using the wafer-supporting sheet extending apparatus is constructed as shown in FIG. 3. The extension spring 41 is formed by a metal plate such as stainless steel or the like to have a substantially C-shape, and pin inserting holes 42 are formed in both extended end portions. The extension spring 41 in an unloaded state is placed at its inner peripheral portion on an extension spring-placing surface 14d of the extension spring-placing unit 14 of the vertically movable base 11 as shown in FIG. 3, and its outer periphery has a size larger than an inner periphery (i.e., an outline of an opening portion 1a) of a frame 1 of a wafer-supporting table 3 for dicing so that it can overlap with the frame 1 as shown in FIGS. 5(D) and 7. Like the conventional one, the wafer-supporting table 3 for dicing is constructed by attaching a circular wafer-supporting sheet 2 made of vinyl chloride and the like via an adhesive (not shown) to a lower surface of the ring-shaped frame 1 made of a metal such as stainless steel or the like and having the circular opening portion 1a. A wafer 4 placed on the table 3 is similar to the conventional one, and hence a detailed explanation thereof is omitted.

Then, the manner of extending the wafer-supporting sheet 2 on the wafer-supporting table 3 for dicing by means of the wafer-supporting sheet extending apparatus will be explained. At first, the wafer-supporting table 3 for dicing is secured to the wafer-supporting table fixing means in a state that the diced wafer 4 is placed on a central portion of the upper surface of the wafer-supporting sheet 2 of the table 3. In this state, the vertically movable base 11 and vertically movable table 21 are located in their lowered positions. Further, the first cylinder 25 is in a retracted state, and the movable table 24 is located in a limit position in the Y-direction. The paired second cylinders 29 are also in a retracted state, and the paired extension spring-contracting pins 31 are located in positions where they are separated from each other.

Figure 4:
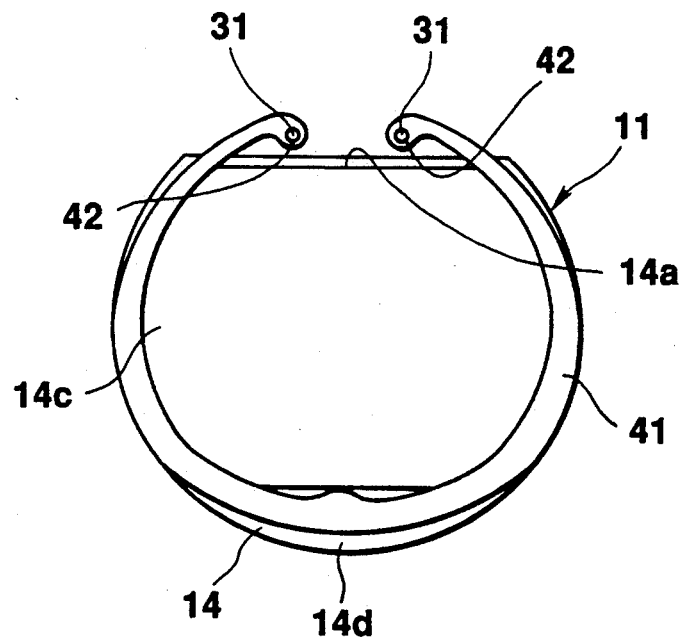
FIG. 4 is a plan view showing a state in which the extension spring in FIG. 3 is contracted.
Figure 6:
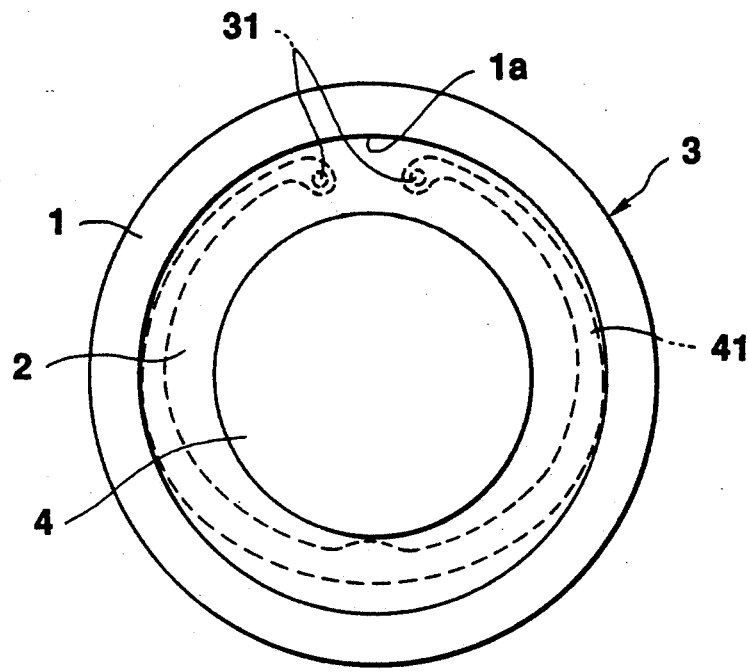
FIG. 6 is a plan view of FIG. 5(A)

In this state, as shown in FIG. 3, the extension spring 41 in the unloaded state is placed on the extension spring-placing surface 14d of the extension spring-placing unit 14, and the extension spring-contracting pins 31 are fitted into the pin inserting holes 42. Thereafter, the first cylinder 25 is set in a shaft projecting state, thereby moving the movable table 24 to a limit position in a direction opposing to the Y-direction, and thus approaching the extension spring-contracting pins 31 to the flat surface 14a of the extension spring-placing unit 14. Further, the paired second cylinders 29 are set in their shaft projecting state, thereby approaching the extension spring-contracting pins 31 to each other. As a result, as is shown in FIGS. 4 and 5(A), the extension spring 41 is contracted and the inner peripheral surface thereof is brought into contact with the outer peripheral surface of the projecting portion 14c of the extension spring-placing unit 14. In this state, as is shown in FIG. 6, the outer peripheral circle of the extension spring 41 is smaller than the inner peripheral circle of the frame 1, so that the spring 41 is contracted to a size with which it can be inserted into the opening portion 1a of the frame 1.

Figure 5B:
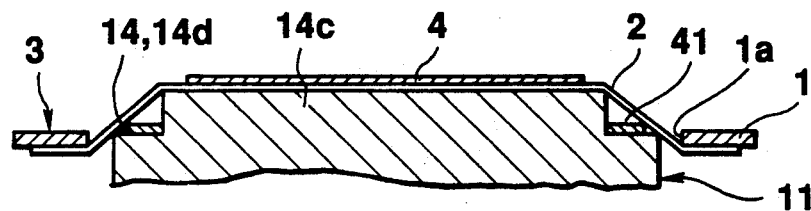
Figure 5C:
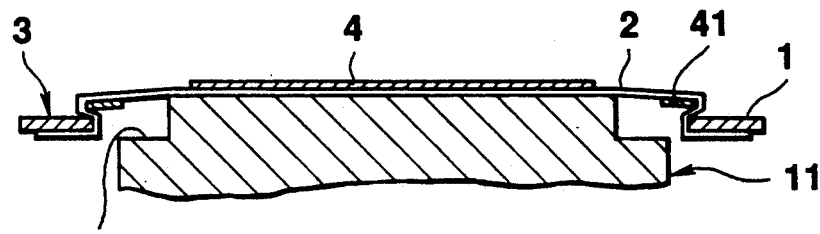
Figure 5D:
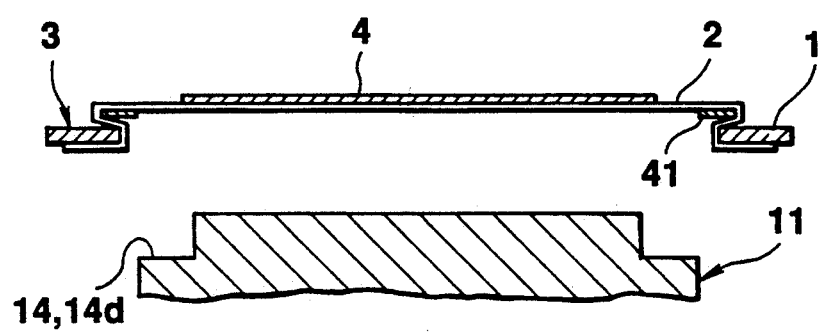

Subsequently, as is shown in FIG. 5(B), when the vertically movable base 11 and vertically movable table 21 are simultaneously moved upward to their upward positions, the extension spring-placing unit 14 is moved into the opening portion 1a of the frame 1 from under the same, and the upper surface of the projecting portion 14c pushes upwardly the wafer-supporting sheet 2, thereby extending the same. At this time, the extension spring 41 placed on the extension spring-placing surface 14d is positioned above the frame 1. Then, the vertically movable base 11 is moved downward, and at the same time the first and second cylinders 25 and 29 are set in the retracted state, thereby separating the extension spring-contracting pins 31 from each other, and separating the extension spring 41 from the flat surface 14a of the extension spring-placing unit 14. Thus, after the spring 41 returns to the unloaded state through a state shown in FIG. 5(C). In the unloaded state, an outer peripheral portion of the spring 41 is overlapped over an upper surface of an inner peripheral portion of the frame 1 with the wafer-supporting sheet 2 being sandwiched therebetween, thereby extending the sheet 2 in its surface direction, as is shown in FIGS. 5(D) and 7. Then, the vertically movable table 21 is lowered, thereby disengaging the extension spring-contracting pins 31 from the pin inserting holes 42 of the extension spring 41. Thus, the wafer-supporting sheet 2 is extended, and the gap between chips produced by dicing the wafer 4 is broaden in accordance with the degree of extension.

As described above, in the wafer-supporting-sheet extending method of the invention, the wafer-supporting sheet 2 is extended in its surface direction by the generally C-shaped extension spring 41. In other words, the sheet 2 can be extended by use of only a single tool (=extension spring 41). Further, since the extension spring 41 can be made greatly thinner than the conventional extension rings 5 and 6, the total height (=the total of the thickness of the frame 1, the thickness of the extension spring 41, three times of the thickness of the wafer-supporting sheet 2, and the thickness of the wafer 4) of the device shown in FIG. 5(D) can be decreased as compared to the conventional one. Accordingly, the number of required tools and hence the manufacturing cost can be reduced. Moreover, a small space will be enough to storage a plurality of the devices (each of which is in the state as shown in FIG. 5(D)) while they are arranged in a vertical direction with they being held in a horizontal posture. In addition, as is shown in FIG. 5(D), the wafer-supporting sheet 2 is extended by the extension spring 41 such that the sheet 2 has a substantially S-shaped cross section, so that the amount of extension can be increased.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of extending a wafer-supporting sheet comprising:

a step of preparing a wafer-supporting table which is constructed by attaching a circular wafer-supporting sheet to a lower surface of a ring-shaped frame, a wafer placed on an upper surface of the wafer-supporting sheet and divided into chips, and a C-shaped extension spring having an outer diameter larger than an inner diameter of the ring-shaped frame when the spring is unloaded;

a step of contracting the extension spring by applying an external force so that the outer diameter of the spring becomes smaller than the inner diameter of the ring-shaped frame;

a step of extending the wafer-supporting sheet by positioning a portion of the sheet, which is located inside of an inner periphery of the frame, above the frame with an external force applying to the portion of the sheet;

a step of positioning the extension spring above the frame by inserting the extension spring from under the wafer-supporting table into an inner space surrounded by the inner periphery of the frame;

a step of releasing the external force applied to the extension spring; and a step of releasing the external force applied to the portion of the sheet which is located inside of the inner periphery of the frame.

2. The method according to claim 1, wherein the step of extending the wafer-supporting sheet comprises pushing up the portion of the wafer-supporting sheet, which is located inside of the inner periphery of the frame, to position the portion of the sheet above the frame.

3. The method according to claim 2, wherein pin inserting holes are formed in both extended ends of the extension spring, and the extension spring is contracted by action of pins fitted into the pin inserting holes.

4. The method according to claim 3, wherein the step of extending the wafer-supporting sheet and the step of positioning the extension spring above the frame are performed at the same time.

5. The method according to claim 4, wherein the step of releasing the external force applied to the extension spring and the step of releasing the external force applied to the portion of the sheet which is located inside of the inner periphery of the frame are performed at the same time.

6. The method according to claim 5, wherein the extension spring is made of stainless steel.

7. The method according to claim 6, wherein the wafer-supporting sheet of the wafer-supporting table is made of vinyl chloride.

8. The method according to claim 2, wherein the wafer-supporting sheet is extended by pushing up the portion of the sheet, which is located inside of the inner periphery of the frame, with an upper surface of a projecting portion of a base.

9. The method according to claim 8, wherein in the step of positioning the extension spring above the frame, the extension spring is located around the projecting portion of the base.

10. The method according to claim 9, wherein pin inserting holes are formed in both extended ends of the extension spring, and the extension spring is contracted by action of pins fitted into the pin inserting holes.

11. The method according to claim 10, wherein the step of extending the wafer-supporting sheet and the step of positioning the extension spring above the frame are performed at the same time.

12. The method according to claim 11, wherein the step of releasing the external force applied to the extension spring and the step of releasing the external force applied to the portion of the sheet which is located inside of the inner periphery of the frame are performed at the same time.

13. The method according to claim 12, wherein the extension spring is made of stainless steel.

14. The method according to claim 13, wherein the wafer-supporting sheet of the wafer-supporting table is made of vinyl chloride.

15. The method according to claim 1, wherein pin inserting holes are formed in both extended ends of the extension spring, and the extension spring is contracted by action of pins fitted into the pin inserting holes.

16. The method according to claim 15, wherein the step of extending the wafer-supporting sheet and the step of positioning the extension spring above the frame are performed at the same time.

17. The method according to claim 16, wherein the step of releasing the external force applied to the extension spring and the step of releasing the external force applied to the portion of the sheet which is located inside of the inner periphery of the frame are performed at the same time.

18. The method according to claim 17, wherein the extension spring is made of stainless steel.

19. The method according to claim 18, wherein the wafer-supporting sheet of the wafer-supporting table is made of vinyl chloride.

* * * * *